(12) United States Patent
Long

(10) Patent No.: US 6,359,213 B1
(45) Date of Patent: Mar. 19, 2002

(54) EMISSIONS BLOCKING APPARATUS

(76) Inventor: L. Jacqueline Long, 70 W. 95 St., Apt. 22B, New York, NY (US) 10025

( * ) Notice: Subject to any disclaimer, the term of this patent is extended or adjusted under 35 U.S.C. 154(b) by 0 days.

(21) Appl. No.: 09/427,573

(22) Filed: Oct. 26, 1999

(51) Int. Cl.[7] .............................................. H05K 9/00
(52) U.S. Cl. ............................... 174/35 R; 174/35 MS; 361/818
(58) Field of Search .......................... 174/35 MS, 35 R, 174/35 GC; 361/816, 818; 428/209, 40.1, 284, 285, 286; 250/505.1, 515.1, 516.1, 519.1

(56) References Cited

U.S. PATENT DOCUMENTS

| | | | |
|---|---|---|---|
| 4,836,783 A | * 6/1989 | Harper | 434/87 |
| 5,155,316 A | * 10/1992 | Chiu | 219/10.491 |
| 5,244,708 A | * 9/1993 | Tsuchida et al. | 428/77 |
| 5,573,857 A | * 11/1996 | Auger | 428/480 |
| 5,595,801 A | * 1/1997 | Fahy et al. | 428/40.1 |
| 5,621,188 A | * 4/1997 | Lee et al. | 174/35 MS |
| 5,676,812 A | * 10/1997 | Kadokura | 205/50 |
| 5,935,706 A | * 8/1999 | Hoover et al. | 428/375 |

* cited by examiner

Primary Examiner—Dean A. Reichard
Assistant Examiner—Carmelo Oliva
(74) Attorney, Agent, or Firm—Designer Patents; David A. Fleming

(57) ABSTRACT

An emissions blocking, diverting and deflecting apparatus in both adhesive roll and peel-off adhesive sheet forms that is placed between a user and harmful emissions from an emitting device to protect the user from the dangerous emissions.

2 Claims, 2 Drawing Sheets

EMISSIONS BLOCKING APPARATUS

FIELD AND BACKGROUND OF THE INVENTION

The present invention relates to the field of electromagnetic emissions blocking devices and to means for providing convenient protection from cell phone emissions.

Cellular telephones are becoming ubiquitous as they are being widely adopted. Even children and students are carrying cell phones to schools and dormitories. Cell phones are beginning to replace regular land line phones. There is evidence indicating that there may be risks associated with use of cell phones relating to electromagnetic emissions. This invention is intended to provide cellular telephone users the means to attenuate such risks given the almost inevitable pervasive adoption and use of cell phones.

There is much discussion in the media today about electromagnetic emission fields (EMF) including both ionizing radiation such as X-rays and nuclear radiation and non-ionizing radiation such as radio waves, microwaves, and radar. The dangers of ionizing radiation are well known. According to published reports, there is now little doubt among researchers and scientists involved in EMF studies that non-ionizing radiation is capable of causing biological change. The mechanisms by which such change occurs, the potential of that change, and the differences between radiation exposure and dose are not yet understood. Recent reports conclude that evidence that EMFs pose a cancer risk cannot be dismissed. However weak the evidence is, there is reason enough for prudent avoidance.

Radiation shields are known in the art. It is known that materials of relative conductivity above 0.5 are useful in electromagnetic shielding. The materials can be in a variety of forms including wire mesh, embedded filings, and powders.

It is known that a user may shield himself or herself from harmful emissions by attaching a protective magnetic radiation shield jacket to contain the cellular phone within the jacket. It is also know to form a shield between the user and the cellular phone. However, the shields of art are not rollable, convenient for storing and resizable with minimal effort. Furthermore, they are generally made to adapt to a specific make or model of cellular phone, making them difficult to find for any one given make or model. Additionally, they do not blend well with clothing, and they are not useful in selectively protecting sensitive parts of the body. Consequently, cell phone users may expose themselves to unnecessary risk simply because the forms of protection available previously have been too cumbersome, too expensive, or too difficult to find and adapt to their specific needs.

BRIEF SUMMARY OF THE INVENTION

The object of this invention is to provide an electromagnetic emissions blocking, diverting, and deflecting apparatus in both adhesive roll and peel-off adhesive sheet forms that can be employed by users of emissions emitting devices to protect the users from dangerous emissions.

Another object of the invention is to provide a method by which a consumer can selectively and conveniently create permanent or temporary shielding from electromagnetic waves without the need of altering his or her cell phone or device and without the need of attaching objects to the electromagnetic emissions emitting device.

An additional object of this invention is to provide a reusable supply of material in a consumer kit that will allow the user to specially and selectively apply shielding adhesive material to block harmful electromagnetic emissions.

An additional aim of the invention is to provide a material that can be used on a variety of different sized devices and for a variety of different outfits.

An additional aim of the invention is to provide a better quality of life to those who use electromagnetic wave emitting devices because it allows them to worry less about the potential of harmful effects being caused. Additional advantages of the invention will become apparent as it is described and used by the public.

DETAILED DESCRIPTION OF THE INVENTION

Figure 1:
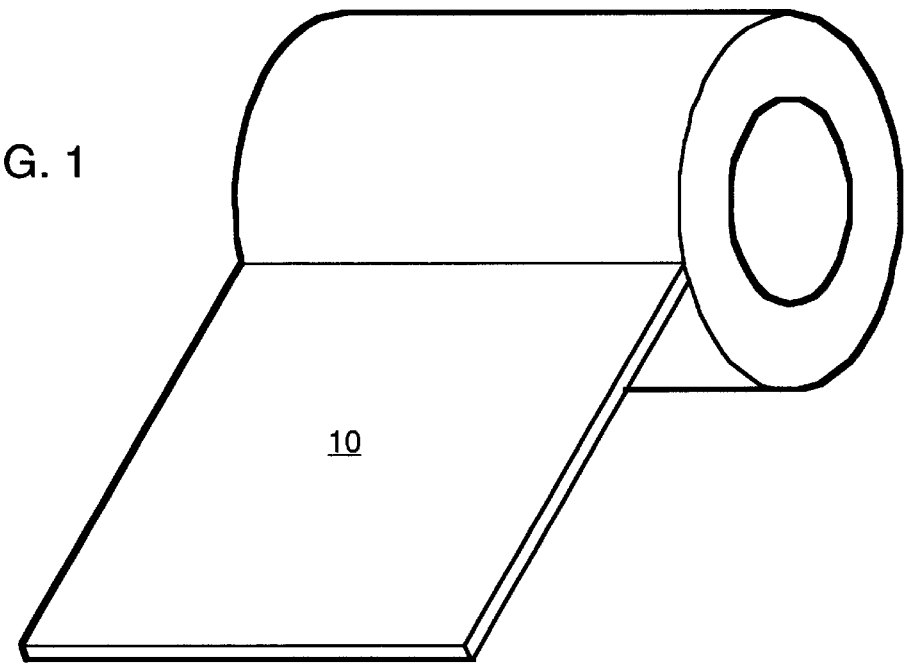
FIG. 1 shows the apparatus (10) in adhesive tape roll format.
Figure 2:
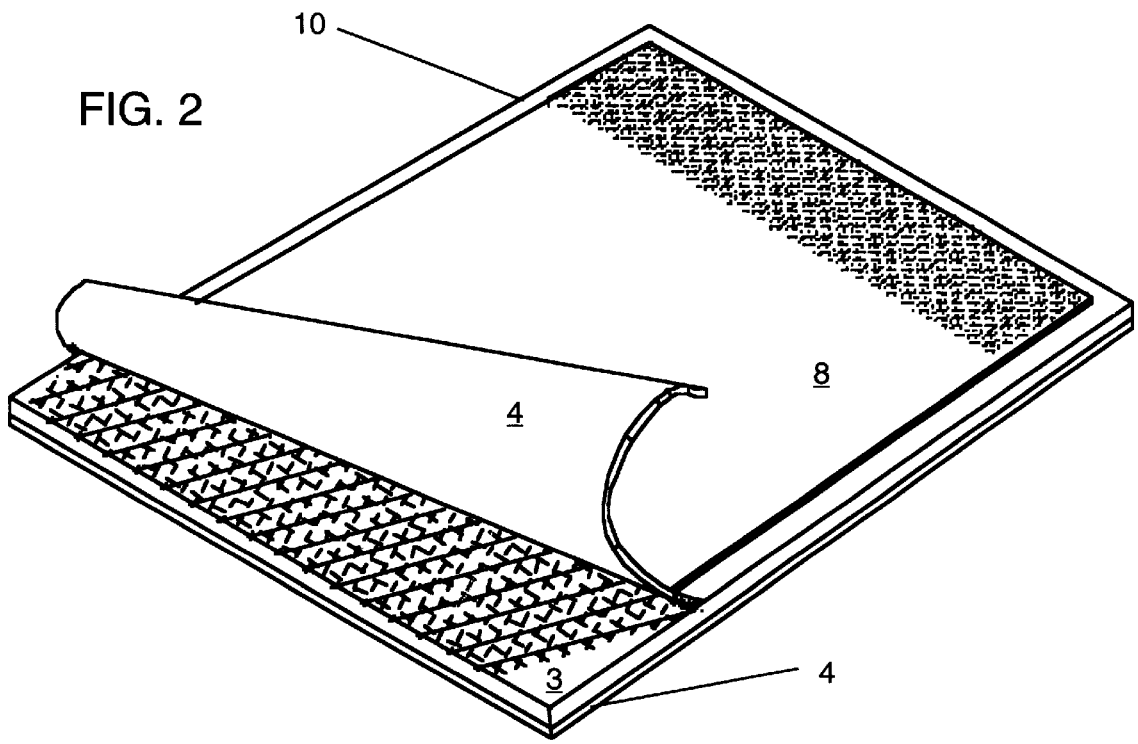
FIG. 2 shows the apparatus (10) in peel-off adhesive sheet format.
Figure 3:
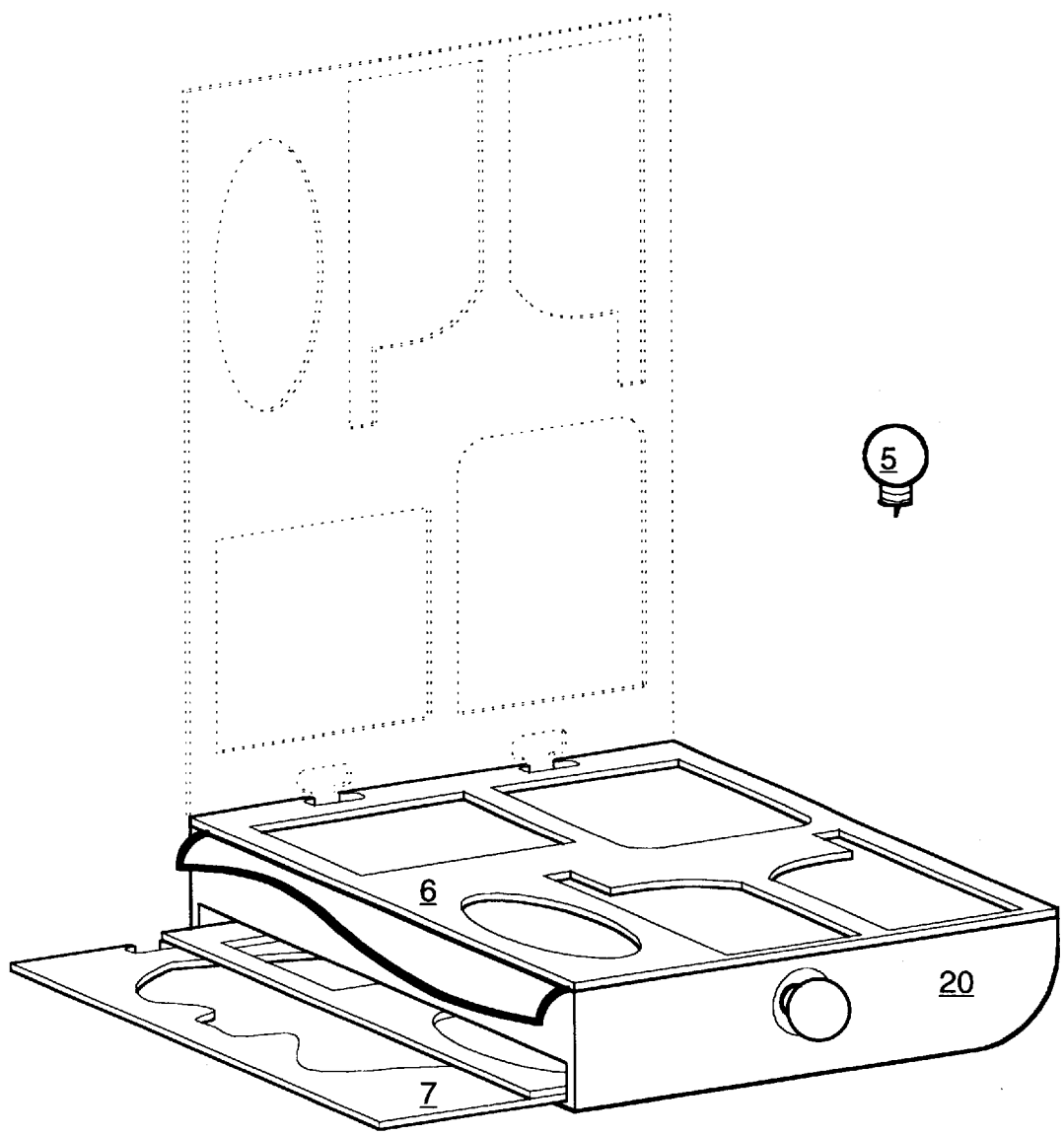
FIG. 3 shows the emissions blocking kit (20) with the integrated cutting tool (5) and the user templates (6).

This invention is intended to provide an electromagnetic emissions blocking, diverting, and deflecting apparatus in both adhesive roll and peel-off adhesive sheet forms that can be employed by users of emissions emitting devices to protect them from dangerous emissions. There is evidence enough to justify prudent avoidance of non-ionizing electromagnetic emissions. Lacking official measures, responsibility falls to users to protect themselves. However to date there are limited means available to users that are convenient to employ and that attenuate the risks associated with cellular phone use. My invention is directed to the user providing a convenient, flexible, pliable, and portable to use and store apparatus which can be employed directly by the user. The user can flexibly apply the electromagnetic emissions blocking and deflecting material to cell phones and any emissions emitting devices as well as to clothing and personal effects worn, carried, and employed by the user. The apparatus can be made ubiquitously available to users in a variety of retail stores as well as through mail order and Internet ordering. In other words, this invention can be easily obtained and used and applied to all kinds of surfaces to protect from dangerous emissions. Packaged in both roll and sheet form, the user can easily tear off, peel off, cut and shape and apply to most surfaces to create a shield from dangerous emissions. The adhesive backing provides a means to deploy a custom shaped shield to a variety of surfaces and formats putting protection directly into the hands of users. This apparatus is uniquely conceived to be conveniently available to users in basic three and four layer formats to be made of shielding material which can be continuously upgraded to keep pace with advances in the science of In one embodiment, the user obtains a complete emissions protection kit (20) which includes a storage sheet or roll of emissions blocking material, a shaping means that includes a cutting means (5 and 8), and cutting guide or application templates (6 and 7) to aid in accurate application of the emission protection. The shielding material is provided on a roller or in sheet form and is easily removed and formed by the user using the cutting means. It is important that the material be easily cut and formed to meet the very specific size and shielding needs. Users may make special forms for clothing so that they can store their emissions emitting devices in their pockets. The user can readily line his or her pocket with the deflecting material.

In another embodiment, a substrate (3) impregnated with powdered aluminum is sandwiched between two materials (4) chosen for aesthetics and comfort. The outer material (4) contains an adhesive material (8) on one side which is applicable to fabrics, plastics and metals.

This invention can incorporate a number of shielding fibers or fabrics. Of course other materials could be substituted such as metal, lead, copper, chromium, gold, silver or other relatively conductive metals. The impregnated powder could be replaced with filings, mesh or other formats.

In another embodiment, a substrate is impregnated with shielding material and is formed as a single layer to which an adhesive is integrally incorporated. Examples of adhesive material include glues and the adhesive known by the trademark "VELCRO". Examples of roll and sheet backing include release coated (or peel-off) liner paper, cardboard and plastic. This configuration provides a convenient, flexible, pliable, and portable medium which is highly customizable and applicable by the user.

It is understood that the shielding kit may be incorporated and sold with the emissions emitting devices. It is also understood that a wide variety of colors and fabrics and materials may be incorporated and offered to the public. Other modifications to the actual layered material may be introduced and still remain within the spirit and scope of the invention.

What is claimed is:

1. A safe, convenient, portable emissions blocking kit comprising a pliable and formable emissions shield, an integrated cutting tool, and application templates, to form a safe, convenient, portable emissions blocking kit, the emissions shield comprising the following materials:

an outer material, an electromagnetic shielding material with two sides wherein one side is adjacent the outer material and an adhesive means, the adhesive means situated adjacent the other side of said shielding material;

The emissions shield further comprising a peelable backing adjacent to the adhesive means;

The outer material, shielding material, adhesive means, and backing arranged in layers, adhered together and packaged in sheet form and roll form.

2. A method of shielding users of emissions emitting devices from dangerous emissions including the following steps:

1) providing an emissions shield in a convenient, pliable and portable form readily shaped by the user;

wherein the emissions shield is a roll or sheet of layered material including a top layer of fabric, a middle layer of electromagnetic blocking, diverting, and deflective material, a layer of adhesive material; and a peelable layer of backing material, the layers adhered together; and wherein the portable form is a kit that includes a storage medium and an integrated cutting means;

2) providing a shaping means to shape-to-fit the emissions shield;

3) providing a peelable means to adhere the emissions shield to clothing and personal effects worn, carried, and utilized by the user to block, divert, and deflect dangerous emissions;

4) cutting the emissions shield in a variety of sizes and shapes to properly fit the user's clothing and personal effects;

5) peeling-off the backing material;

6) adhering the shapes to the clothing and personal effects worn, carried, and utilized by the user in a manner to block, divert, and deflect emissions when the emissions emitting device is used.

* * * * *